(12) United States Patent
Natsume

(10) Patent No.: US 6,495,899 B2
(45) Date of Patent: Dec. 17, 2002

(54) SEMICONDUCTOR DEVICE CAPABLE OF SURELY FIXING VOLTAGE AT WELL

(75) Inventor: Hidetaka Natsume, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/821,101

(22) Filed: Mar. 30, 2001

(65) Prior Publication Data

US 2001/0028091 A1 Oct. 11, 2001

(30) Foreign Application Priority Data

Mar. 31, 2000 (JP) ........................................ 2000-098750

(51) Int. Cl.[7] ................................................ H01L 27/11
(52) U.S. Cl. ........................ 257/508; 257/372; 257/374; 257/503; 257/903
(58) Field of Search ................................. 257/350, 369, 257/372, 374, 375, 376, 503, 508, 520, 903, 904; 252/401

(56) References Cited

U.S. PATENT DOCUMENTS

| 5,200,639 A | * | 4/1993 | Ishizuka et al. | ............. 257/448 |
|---|---|---|---|---|
| 5,453,640 A | * | 9/1995 | Kinoshita | .................... 257/377 |
| 5,459,346 A | * | 10/1995 | Asakawa et al. | ............ 257/347 |
| 5,594,270 A | * | 1/1997 | Hiramoto et al. | ............ 257/393 |
| 5,889,314 A | * | 3/1999 | Hirabayashi | ................ 257/501 |
| 5,896,313 A | * | 4/1999 | Kao et al. | ..................... 257/552 |
| 6,215,155 B1 | * | 4/2001 | Wollesen | ..................... 257/347 |
| 6,252,294 B1 | * | 6/2001 | Hattori et al. | .............. 257/620 |
| 6,277,708 B1 | * | 8/2001 | Bothra et al. | ................ 257/328 |

OTHER PUBLICATIONS

High Density Thin Film Transistor Load SRAM Cell Using Trench DRAM Technology, Sep. 1993, IBM Technical Disclosure Bulletin, vol. No. 36, Issue No. 9A, TDB–AC-C–NO: NA9309581, pp. 581–582.*

Chuang, Dah–zen, *VLSI*, 1995, p. 461.

Sedra and Smith, *Microelectronic Circuits*, 1987, p. 374.

* cited by examiner

Primary Examiner—George C. Eckert, II
(74) Attorney, Agent, or Firm—Foley & Lardner

(57) ABSTRACT

In a semiconductor device including a semiconductor substrate, a well formed on the semiconductor substrate, and a thick field insulating layer for surrounding an active area of the well, a contact structure is buried in a contact hole provided in the thick field insulating layer and connected to the well, so as to fix a voltage at the well.

6 Claims, 19 Drawing Sheets

SEMICONDUCTOR DEVICE CAPABLE OF SURELY FIXING VOLTAGE AT WELL

BACKGROUND OF THE INVENTION

1. Field of the Invention

The present invention relates to a semiconductor device such as a CMOS-type static random access memory (SRAM) device.

2. Description of the Related Art

Generally, one SRAM cell uses a flip-flop constructed by two cross-coupled inverters and two transfer transistors. In this case, each of the inverters has a load element and a drive transistor.

In view of the power consumption, a CMOS-type SRAM cell has been developed where the above-mentioned load element is constructed by a P-channel MOS transistor, while the above-mentioned drive transistor is constructed by an N-channel MOS transistor. This will be explained later in detail.

In the prior art CMOS-type SRAM cell, however, since the voltage at a well is not surely fixed to a definite voltage within the cell, a latch-up phenomenon may occur. In order to suppress or avoid such a latch-up phenomenon, the P-type impurity regions of an N-type well have to be sufficiently separated from the N-type impurity regions of a P-type well, which would reduce the integration density.

SUMMARY OF THE INVENTION

It is an object of the present invention to provide. a semiconductor device such as a CMOS-type SRAM device capable of suppressing or avoiding a latch-up phenomenon.

According to the present invention, in a semiconductor device including a semiconductor substrate, a well formed on the semiconductor substrate, and a thick field insulating layer for surrounding an active area of the well, a contact structure is buried in a contact hole provided in the thick field insulating layer and is connected to the well, so as to fix a voltage at the well.

BRIEF DESCRIPTION OF THE DRAWINGS

The present invention will be more clearly understood from the description set forth below, as compared with the prior art, with reference to the accompanying drawings, wherein:

FIGS. 3A through 9A are plan views for explaining an embodiment of the method for manufacturing a CMOS-type SRAM cell according to the present invention;

FIGS. 3B through 9B are cross-sectional views of FIGS. 3A through 9A, respectively.

DESCRIPTION OF THE PREFERRED EMBODIMENT

Before the description of the preferred embodiment, a prior art CMOS-type SRAM cell will be explained with reference to FIGS. 1, 2A and 2B.

Figure 1:
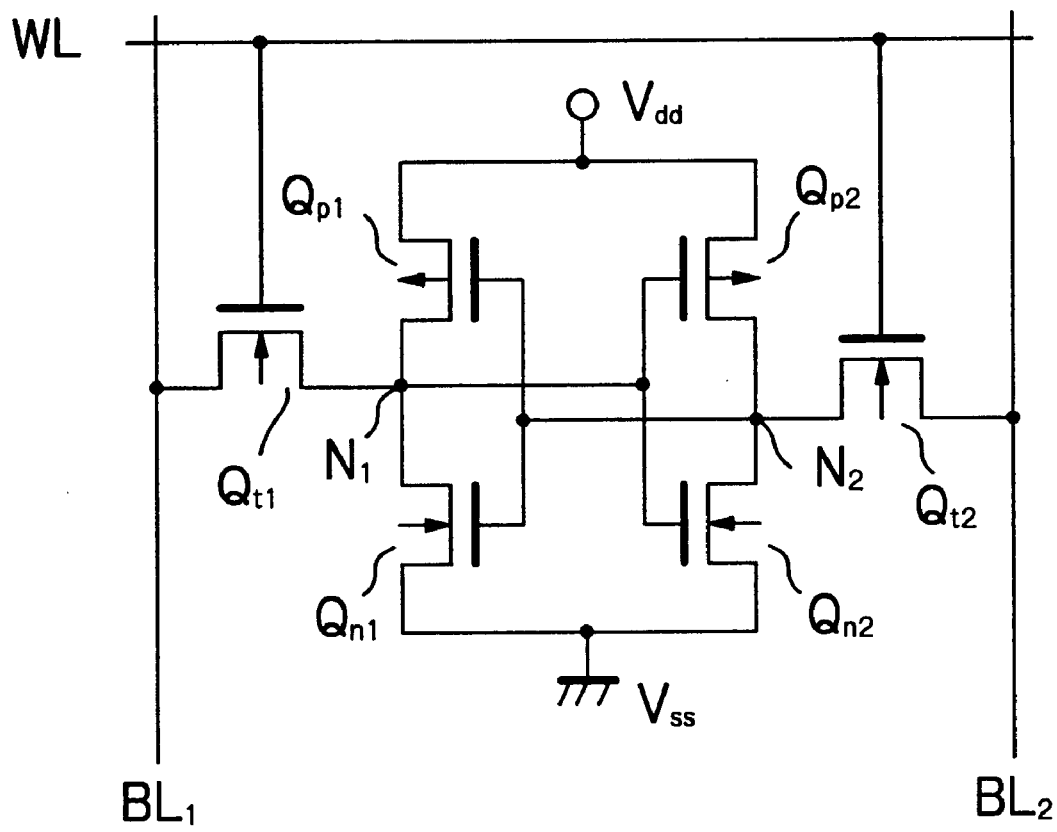
FIG. 1 is an equivalent circuit diagram illustrating a prior art CMOS-type SRAM cell.

In FIG. 1, which is an equivalent circuit diagram illustrating the prior art CMOS-type SRAM cell, one SRAM cell is provided at each intersection between a word line WL and complementary bit lines $BL_1$ and $BL_2$. The SRAM cell is constructed by a flip-flop formed by two cross-coupled inverters and transfer N-channel MOS transistors $Q_{t1}$ and $Q_{t2}$ connected between nodes $N_1$ and $N_2$ of the flip-flop and the bit lines $BL_1$ and $BL_2$. The transfer transistors $Q_{t1}$ and $Qt_2$ are controlled by the voltage at the word line WL.

Each of the inverters is constructed by a load P-channel MOS transistor $Q_{p1}(Q_{p2})$ and a drive N-channel MOS transistor $Q_{n1}(Q_{n2})$ between a high power supply line $V_{dd}$ and a low power supply line $V_{ss}$. The node $N_2$ is connected to the gates of the transistors $Q_{p1}$ and $Q_{n1}$, so that the inverter formed by the transistors $Q_{p1}$ and $Q_{n1}$ is driven by the voltage at the node $N_2$. Similarly, the node $N_1$ is connected to the gates of the transistors $Q_{p2}$ and $Q_{n2}$, so that the inverter formed by the transistors $Q_{p2}$ and $Q_{n2}$ is driven by the voltage at the node $N_1$.

Figure 2A:
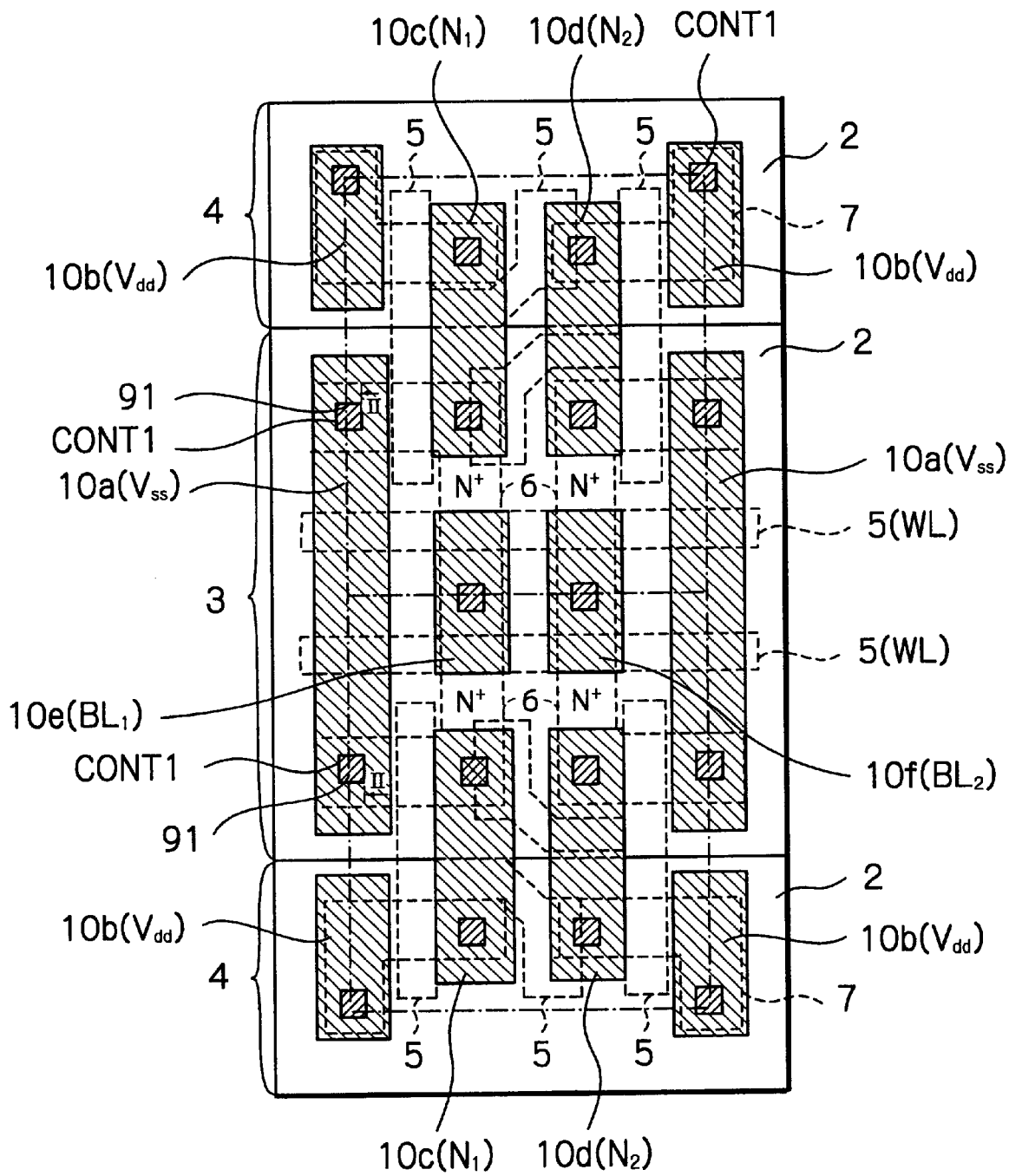
FIG. 2A is a plan view of the CMOS-type SRAM cell of FIG. 1.
Figure 2B:
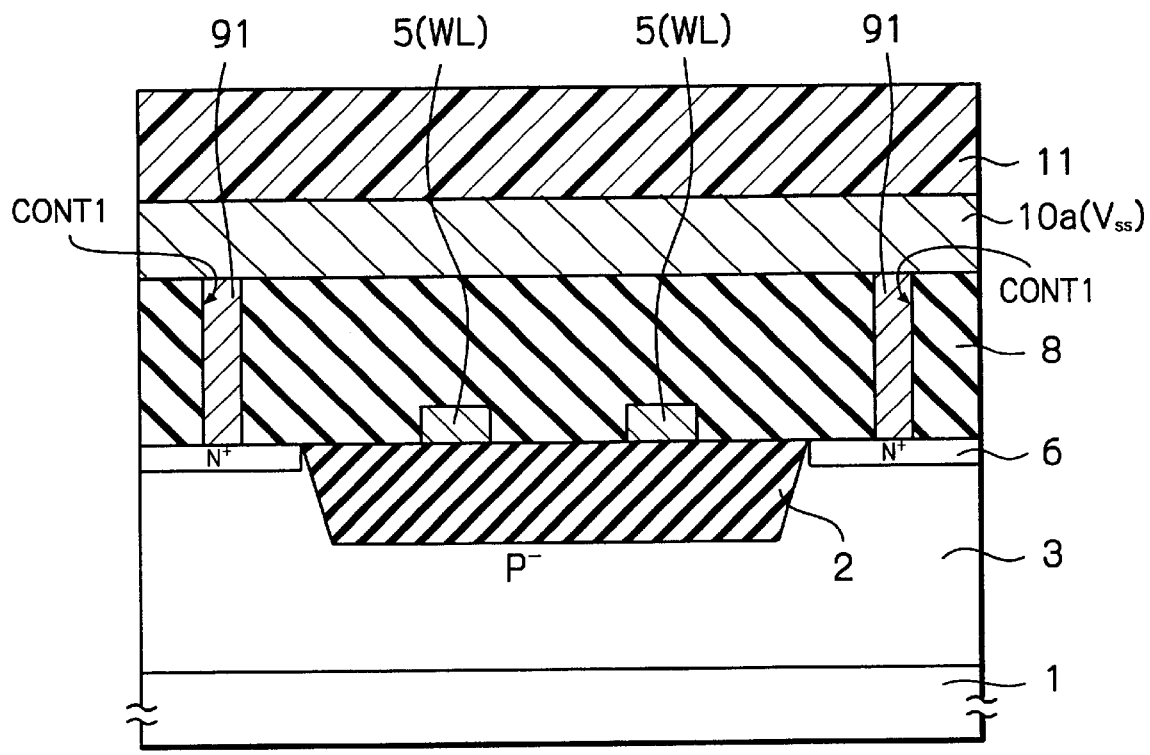
FIG. 2B is a cross-sectional view taken along the line II—II of FIG. 2A.

FIG. 2A is a plan view of the two CMOS-type SRAM cells of FIG. 1, and FIG. 2B; is a cross-sectional view taken along the line II—II of FIG. 2A. in which two CMOS-type SRAM cells are illustrated by solid-dotted lines.

In FIGS. 2A and 2B, reference numeral 1 designates a monocrystalline silicon substrate on which a P-type well 3 and an N-type well 4 are formed.

Also, a thick field silicon oxide layer 2 is formed on the P-type well 3 and the N-type well 4 to isolate active areas where MOS transistors will be formed.

Further, a gate electrode layer 5 serving as gates of the transistors $Q_{t1}$, $Q_{t2}$; $Q_{p1}$, $Q_{p2}$, $Q_{n1}$, and $Q_{n2}$ as well as the hid word line WL of FIG. 1 is formed.

Additionally, $N_+$-type impurity diffusion regions 6 are formed in the active areas of the P-type well 3, and $P_+$-type impurity diffusion regions 7 are formed in the active areas of the N-type well 4. Also, an insulating layer 8 is formed on the entire surface.

Also, contact holes CONT1 are perforated in the insulating layer 8, and metal plugs 91 are buried in the contact holes CONT1.

Further, conductive layers 10a, 10b, 10c, 10d, 10e and 10f are formed. In this case, the conductive layers 10a and 10b are connected to the low power supply line $V_{ss}$ and the high power supply line $V_{dd}$, respectively, of FIG. 1, and the conductive layers 10c and, 10d serve as the nodes $N_1$, and $N_2$, respectively, of FIG. 1. Also, the conductive layers 10e and 10f are connected to the bit lines $BL_1$ and $BL_2$, respectively, of FIG. 1. Further, an insulating layer 11 is formed on the, entire surface.

In the CMOS-type SRAM cell of FIGS. 2A and 2B, however, since the P-type well 2 is not connected to a region of the low power supply line $V_{ss}$ within the SRAM cell, the voltage at the P-type well 2 is not surely fixed to the low power supply voltage, so that the resistance of the P-type well 2 would increase the voltage at the P-type well 2, thus inviting a latch-up phenomenon.

An embodiment of the method for manufacturing a CMOS-type SRAM cell according to the present invention will be explained next with reference to FIGS. 3A, 3B, 4A, 4B, 5A, 5B, 6A, 6B, 7A, 7B, 8A, 8B, 9A and 9B in which two CMOS-type SRAM cells are illustrated by solid-dotted lines.

Figure 3A:
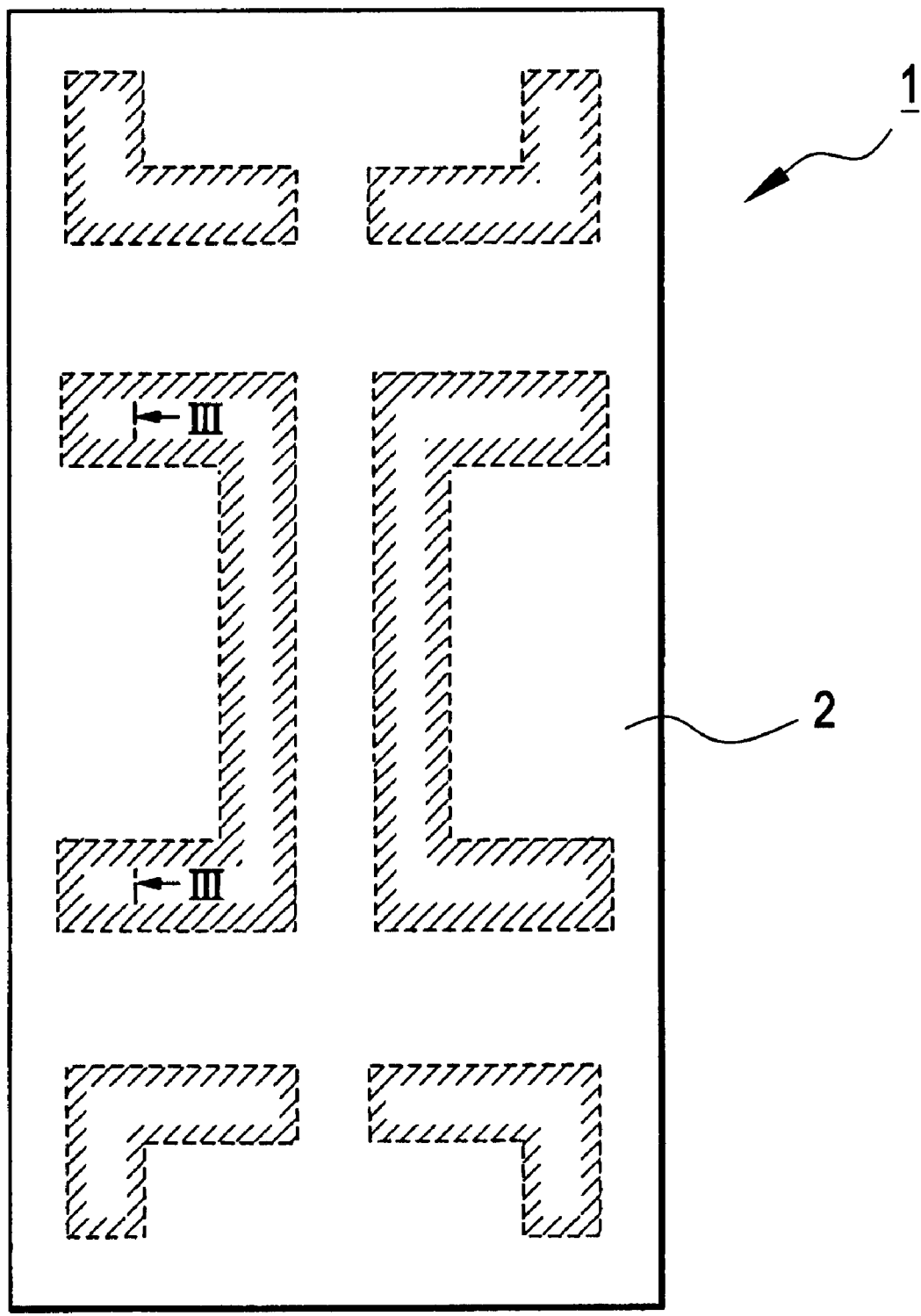
Figure 3B:
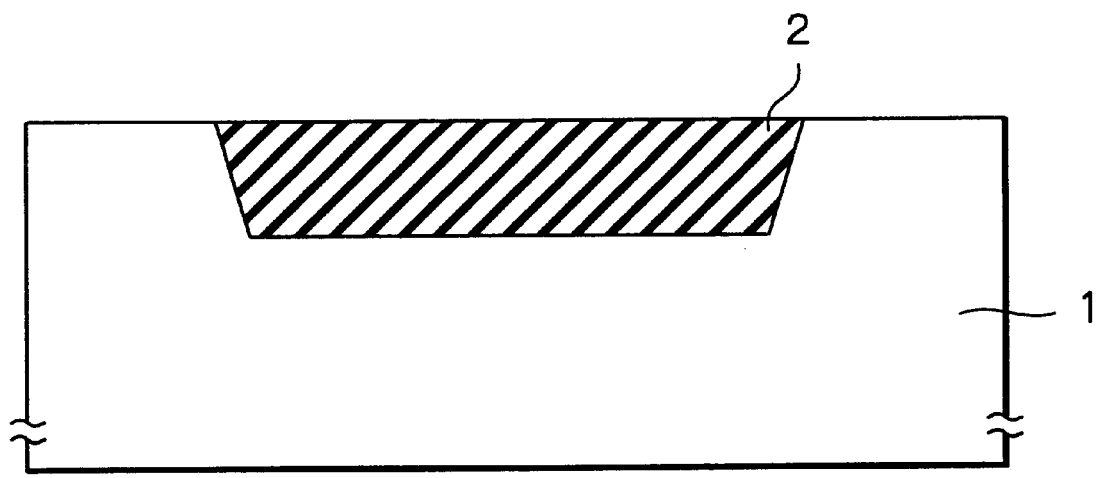

First, referring to FIGS. 3A and FIG. 3B which is a cross-sectional view taken along the line III—III of FIG. 3A, a thick field silicon oxide layer 2 is formed on a P-type or N-type monocrystalline silicon substrate 1 by a shallow trench isolation (STI) process. Note that the STI process includes the steps of forming a silicon nitride pattern, etching the silicon substrate 1 using the silicon nitride pattern as a mask, depositing a silicon oxide layer on the entire surface by a chemical vapor deposition (CVD) process, and performing a chemical mechanical polishing (CMP) process upon the silicon oxide layer and the silicon nitride layer to obtain the thick field silicon oxide layer 2. However, the thick field silicon oxide layer 2 can be formed by a local oxidation of silicon (LOCOS) process or an improved LOCOS process. Thus, active areas indicated by shaded portions are surrounded, i.e., isolated by the thick field silicon oxide layer 2.

Figure 4A:
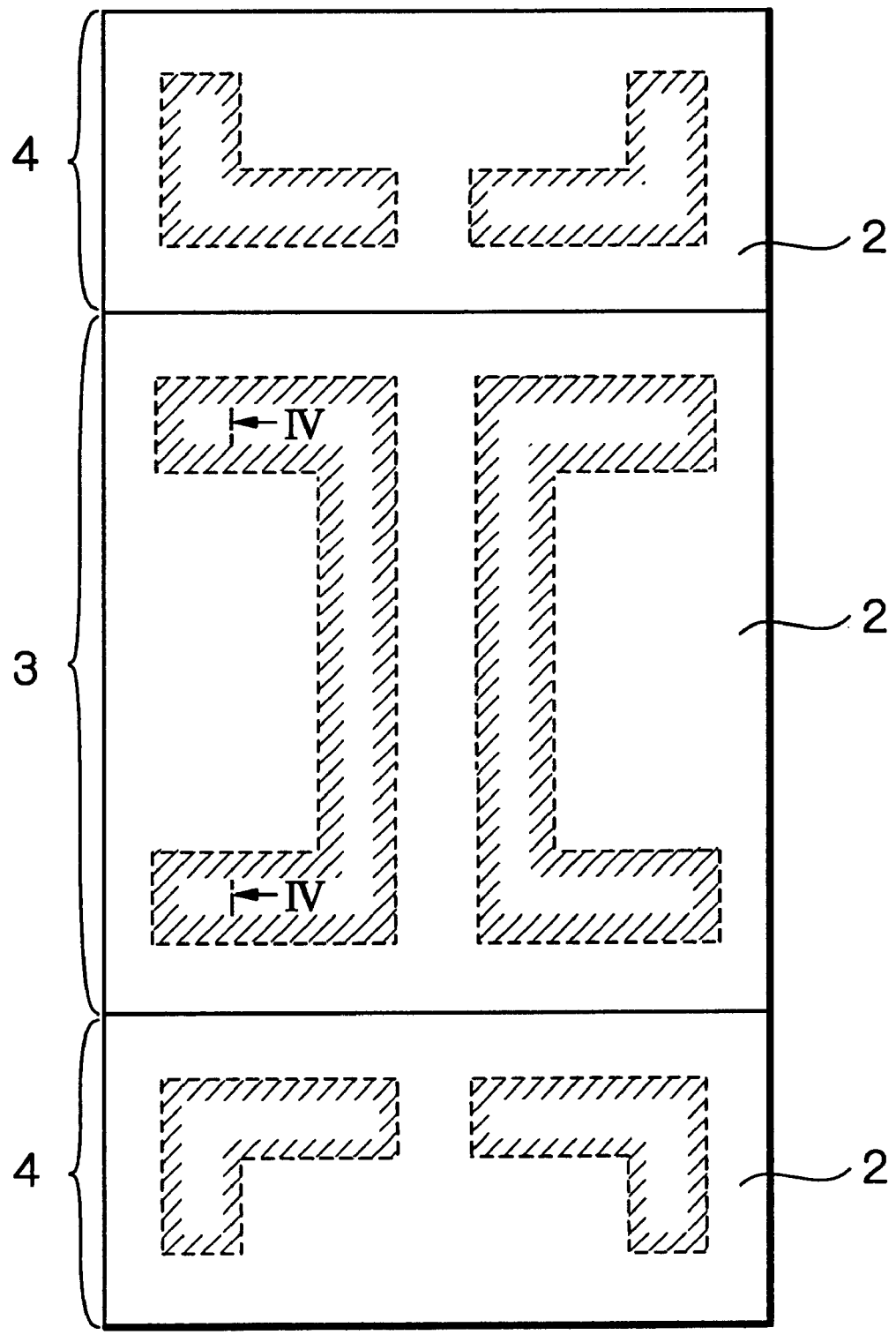
Figure 4B:
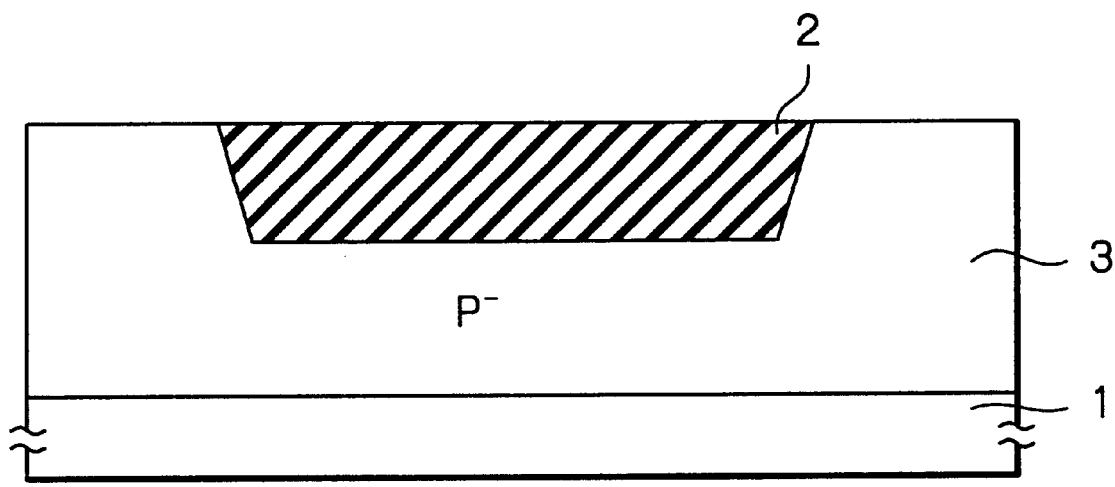

Next, referring to FIG. 4A and FIG. 4B which is a cross-sectional view taken along the line IV—IV of FIG. 4A, a P-type well 3 and an N-type well 4 are formed by implanting impurities into the monocrystalline silicon substrate 1. Then, an about 1to 20 nm thick gate insulating layer (not shown) made of silicon oxide or silicon nitride oxide is deposited on the active areas.

Figure 5A:
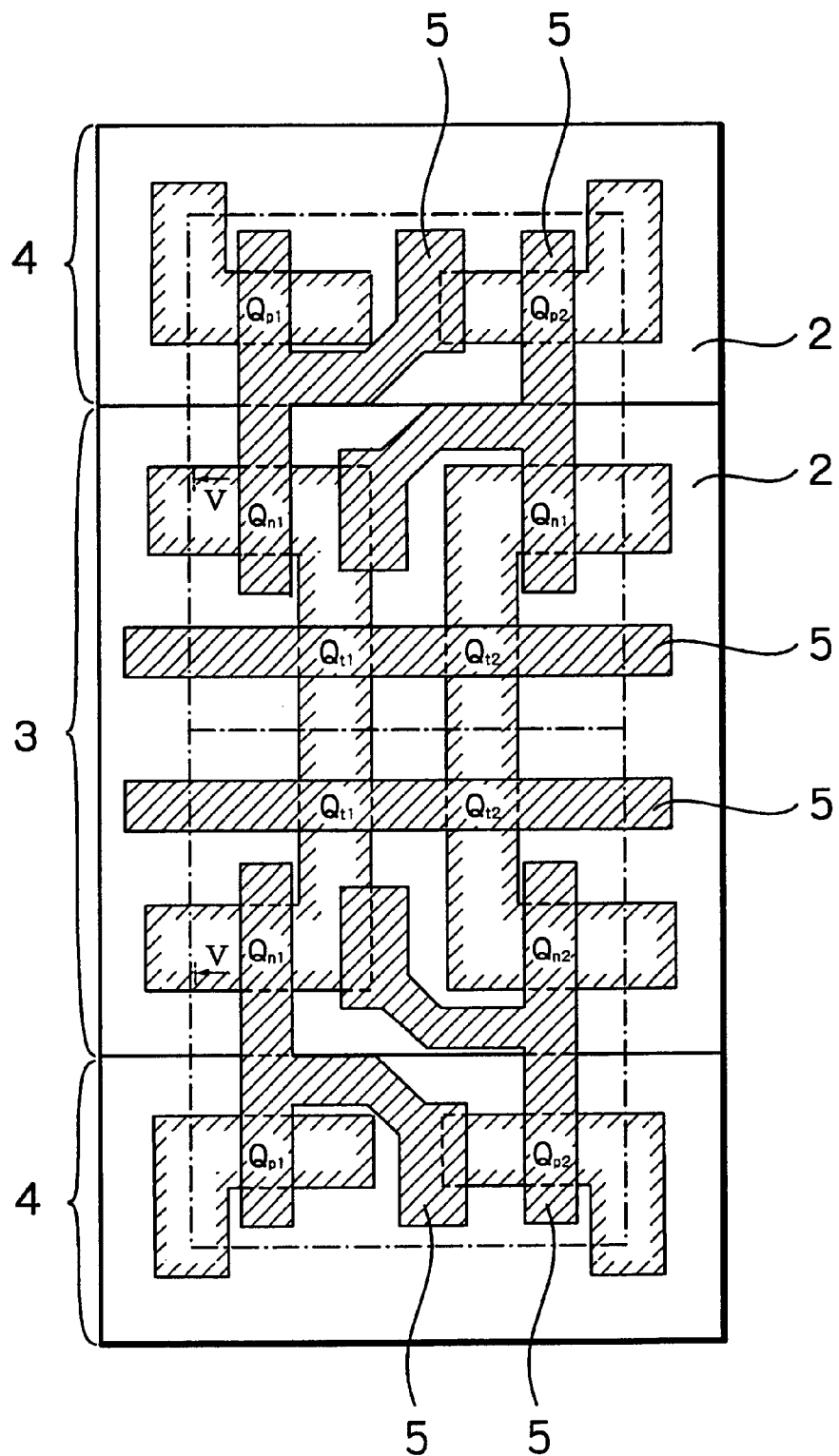
Figure 5B:
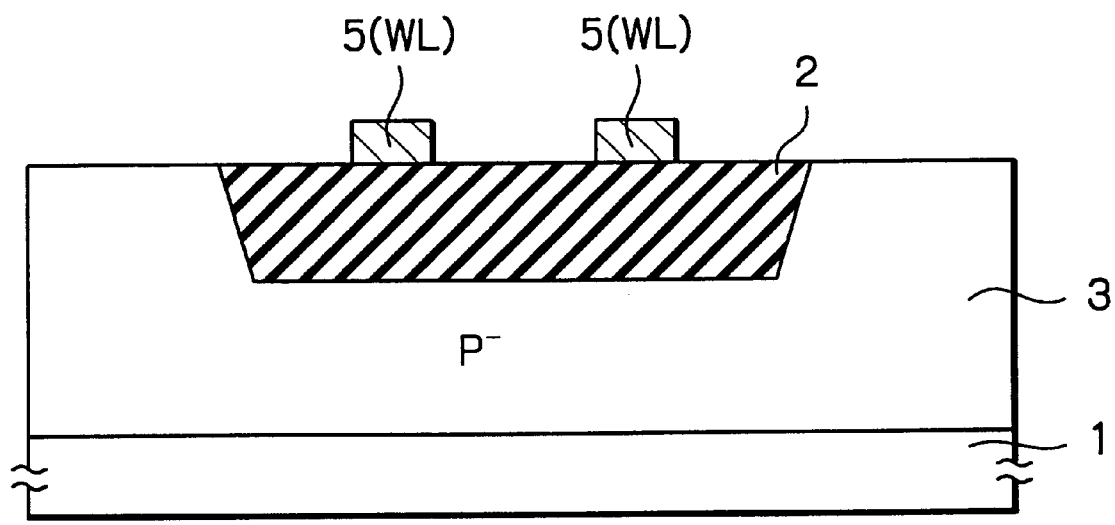

Next, referring to FIG. 5A and FIG. 5B which is a cross-sectional view taken along the line V—V of FIG. 5A, a gate electrode layer 5 made of polycrystalline silicon or polycide (refractory metal/polycrystalline silicon) is formed by a CVD or sputtering process and a photolithography and etching process. The gate electrode layer 5 serves as gates of the transistors $Q_{t1}$, $Q_{t2}$, $Q_{p1}$, $Q_{p2}$, $Q_{n1}$ and $Q_{n2}$ as well as the word line WL of FIG. 1.

Figure 6A:
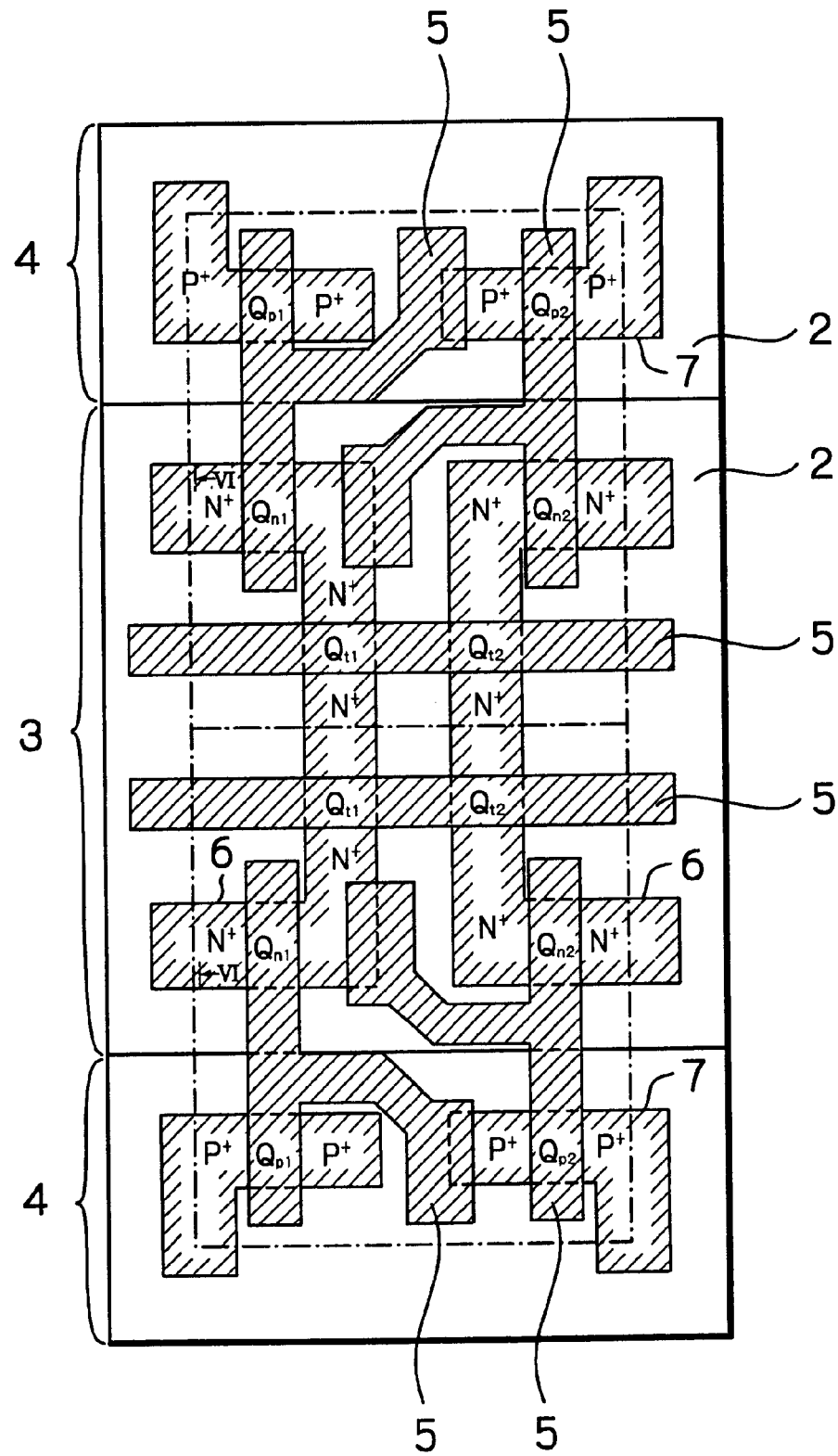
Figure 6B:
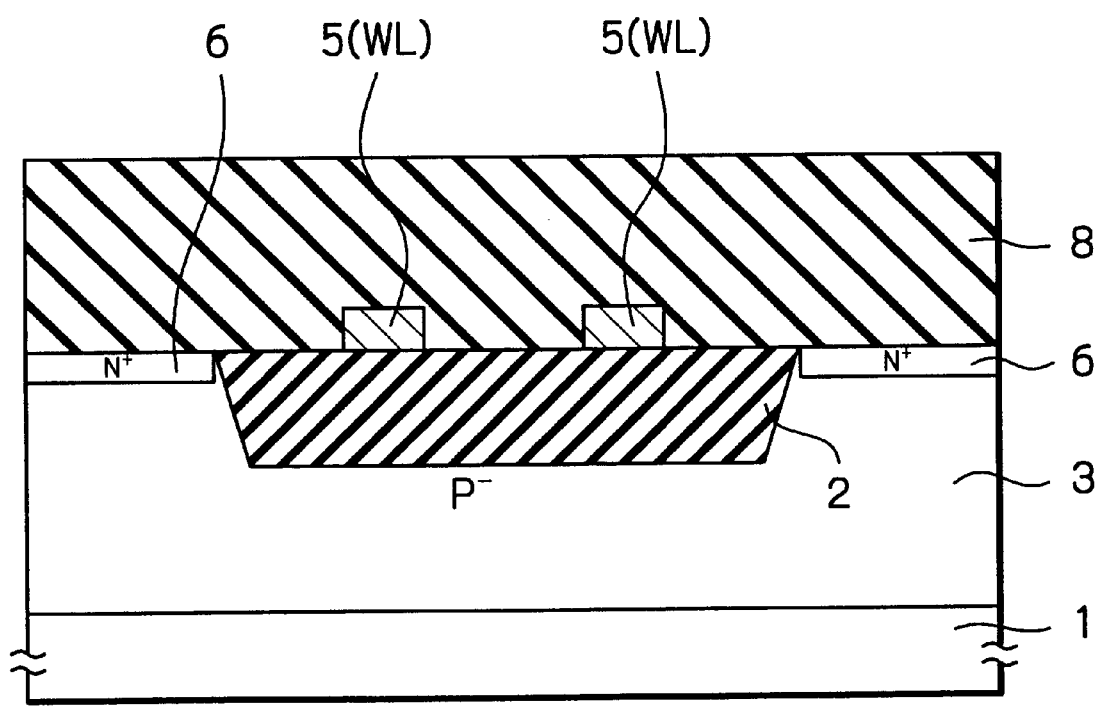

Next, referring to FIG. 6A and FIG. 6B which is a cross-sectional view taken along the line VI—VI of FIG. 6A, N-type impurities such as arsenic ions are implanted into the P-type well 3 by using the gate electrode layer 5 as a mask, to form $N_+$-type impurity diffusion is,regions 6 within the P-type well 3. Thus, N-channel MOS transistors $Q_{t1}$, $Q_{t2}$, $Q_{n1}$ and $Q_{n2}$ are formed. Similarly, P-type impurities such as boron ions are implanted into the N-type well 4 by using the gate electrode layer 5 as a mask, to form $P_+$-type impurity diffusion regions 7 within the N-type well 4. Thus, P-channel MOS transistors $Q_{p1}$ and $Q_{p2}$ are formed. Then, an insulating layer 8 is formed on the entire surface by a CVD process.

Figure 7A:
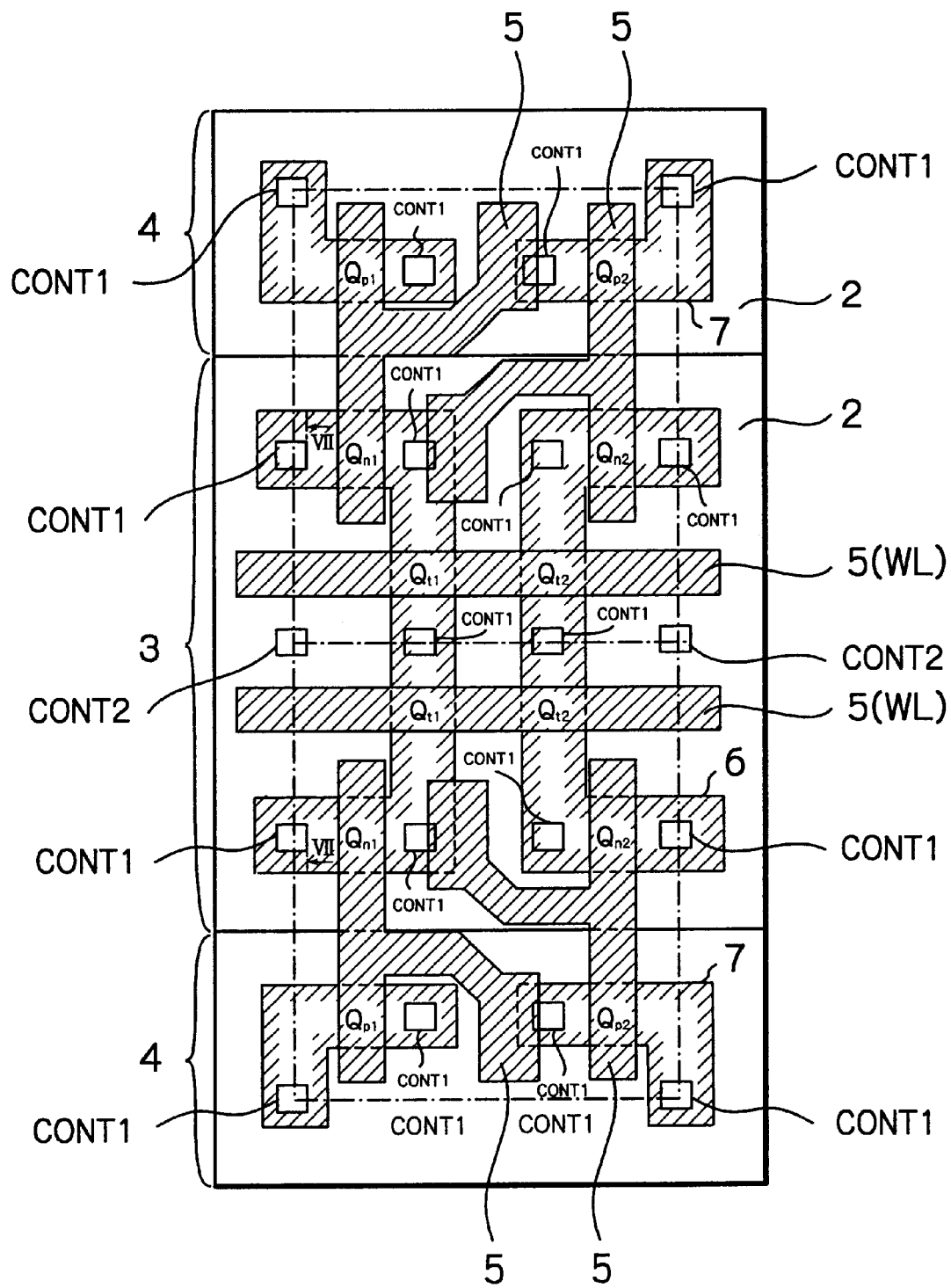
Figure 7B:
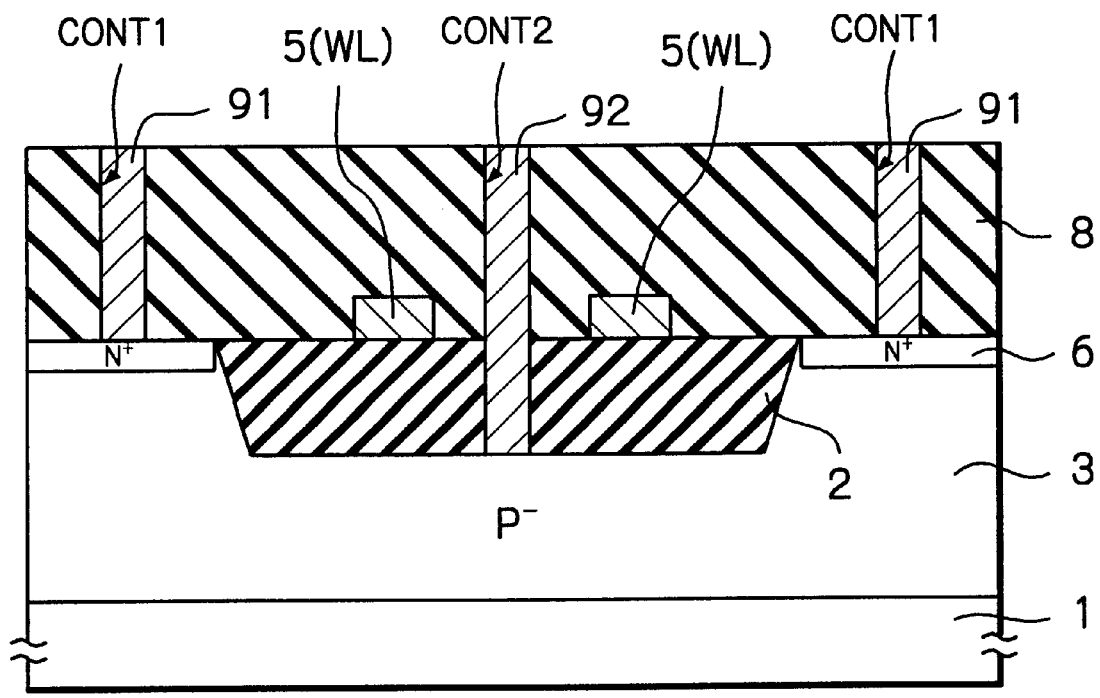

Next, referring to FIG. 7A and FIG. 7B which is a cross-sectional view taken along the line VII—VII of FIG. 7A, contact holes CONT1 are perforated in the insulazting layer 8, and contact holes CONT2 are perforated in the insulating layer 8 as well as the thick field silicon oxide layer 2. Note that the contact holes CONT1 and CONT2 are formed individually or simultaneously. Then, metal plugs 91 and 92 are buried in the contact holes CONT1 and CONT2, respectively.

Figure 8A:
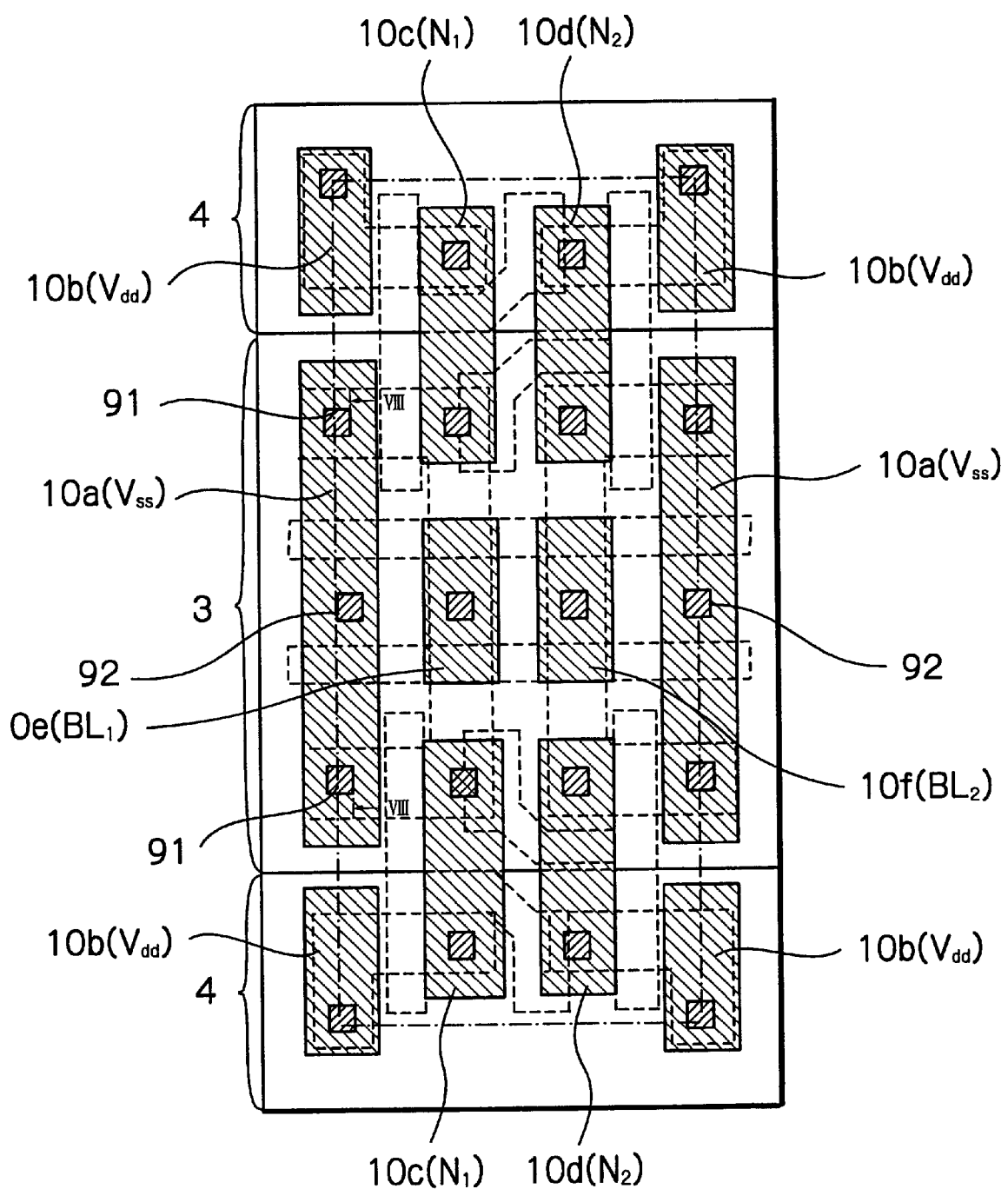
Figure 8B:
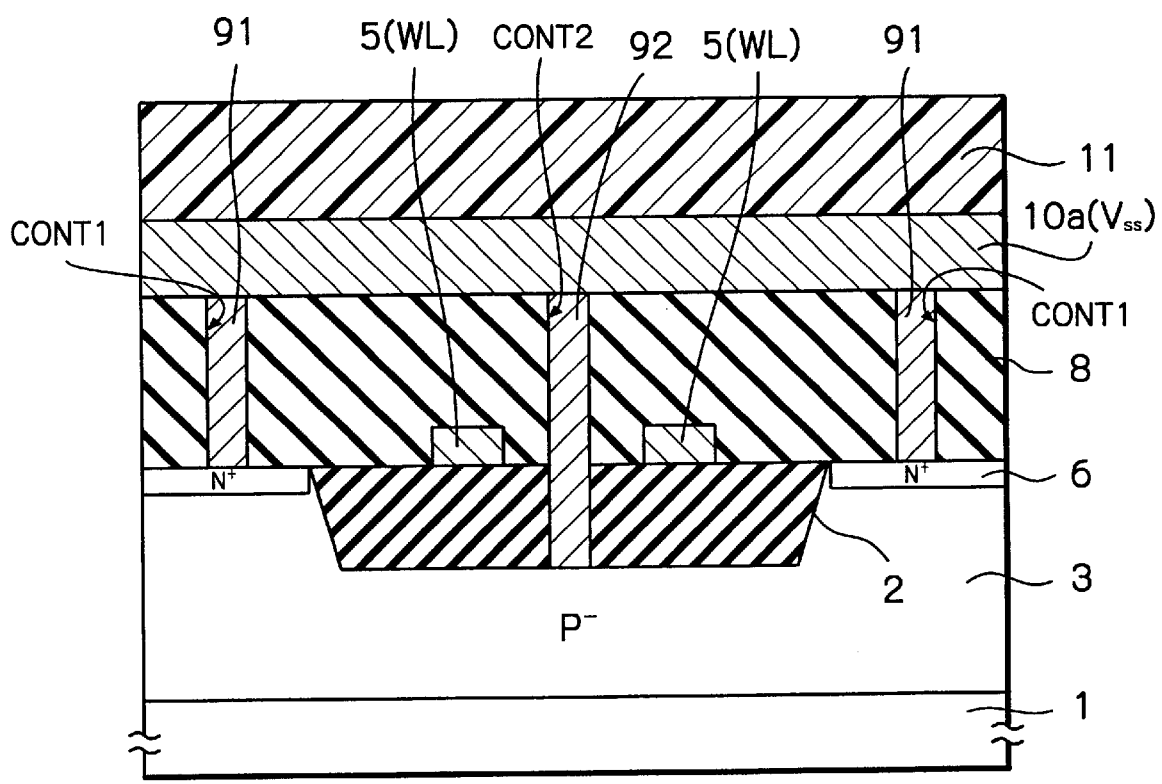

Next, referring to FIG. 8A and FIG. 8B which is a cross-sectional view taken along the line VIII—VIII of FIG. 8A, conductive layers 10a, 10b, 10c and 10d made of aluminum alloy ,refractory metal such as W and W/Ti, or metal/refractory metal such as. Cu/Ti are formed by a sputtering process and a photolithography and etching process. In this case the conductive layers 10a and 10b are connected to the low power supply line $V_{ss}$ and the high power supply line $V_{dd}$, respectively (see FIG. 1). Also, the conductive 10c and 10d serve as the nodes $N_1$ and $N_2$, respectively (see FIG. 1). Further, the conductive layers 10e and 10f are connected to the bit lines $BL_1$ and $BL_2$, respectively (see FIG 1). Then an insulating layer 11 is formed on the entire surface by a CVD process.

Figure 9A:
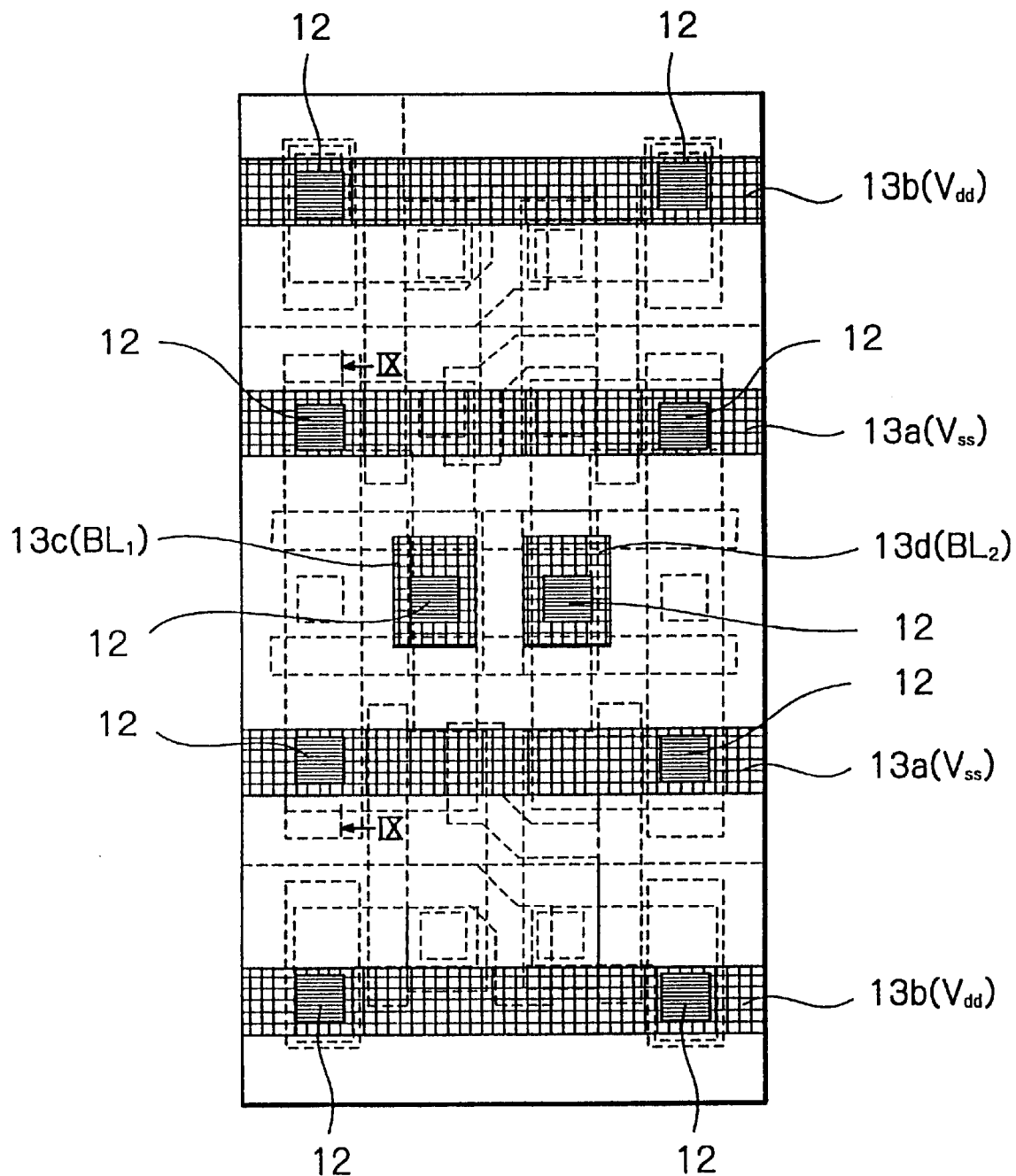
Figure 9B:
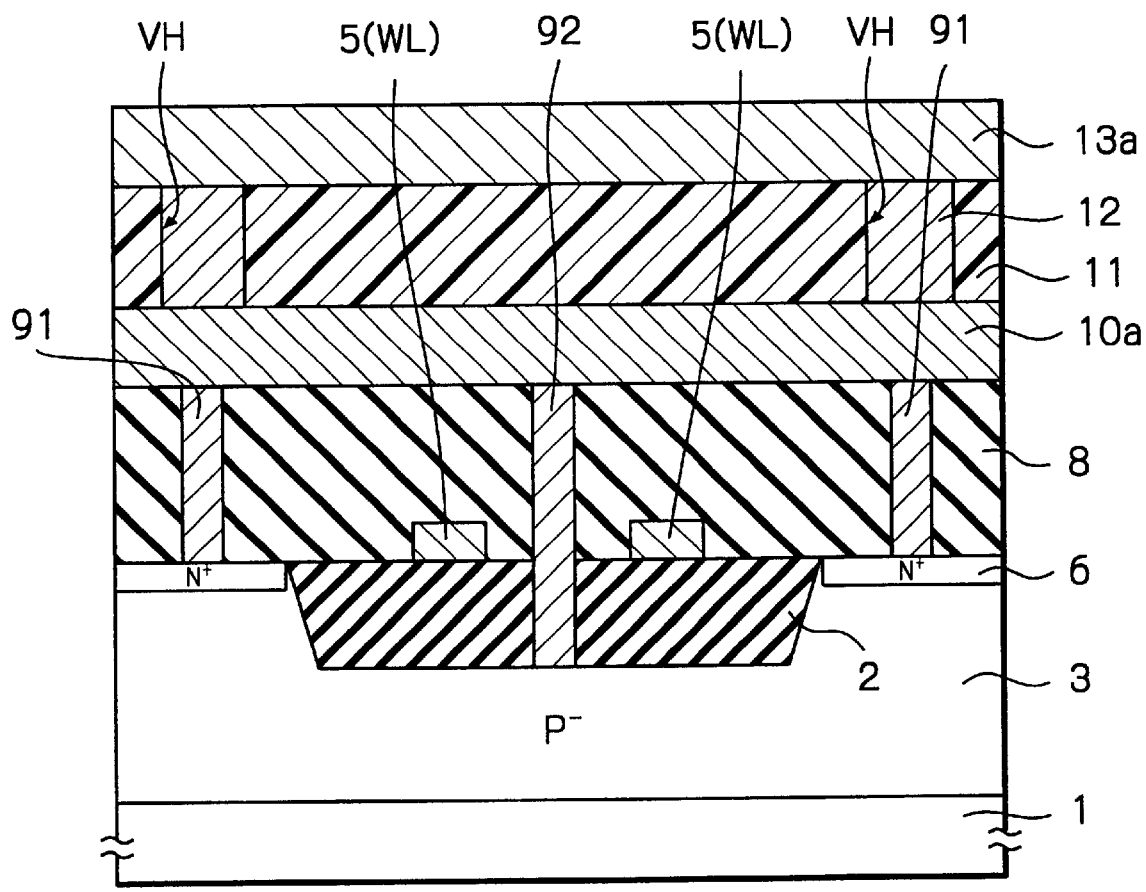

Finally, referring to FIG. 9A and FIG. 9B which is a cross-sectional view taken along the line IX—IX of FIG. 9A, via holes VH are perforated in the insulating layer 11. Then, metal plugs 12 are buried in the via holes VH. Then, conductive layers 13a, 13b, 13c and 13d made of aluminum alloy, refractory metal such as W and W/Ti, or metal/refractory metal such as Cu/Ti are formed by a sputtering process and a photolithography and etching process. In this case, the conductive layers 13a and 13b serve as the low power supply line $V_{ss}$ and the high power supply line $V_{dd}$, respectively (see FIG. 1). Also, the conductive layers 13c and 13d serve as the bit lines $BL_1$ and $BL_2$, respectively (see FIG. 1). Then, a passivation layer (not shown) is formed on the entire surface, thus completing the SRAM cells.

In the above-described embodiment, since the P-type well 3 is connected via the metal plug 92 through the thick field insulating layer 2 as well as the insulating layer 8 to the conductive layer 10a having a low power supply voltage, the voltage at the P-type well 3 is surely fixed to the low power supply voltage, so that the fluctuation of the voltage at the P-type well can be suppressed, which would avoid the latch-up phenomenon.

Figure 10A:
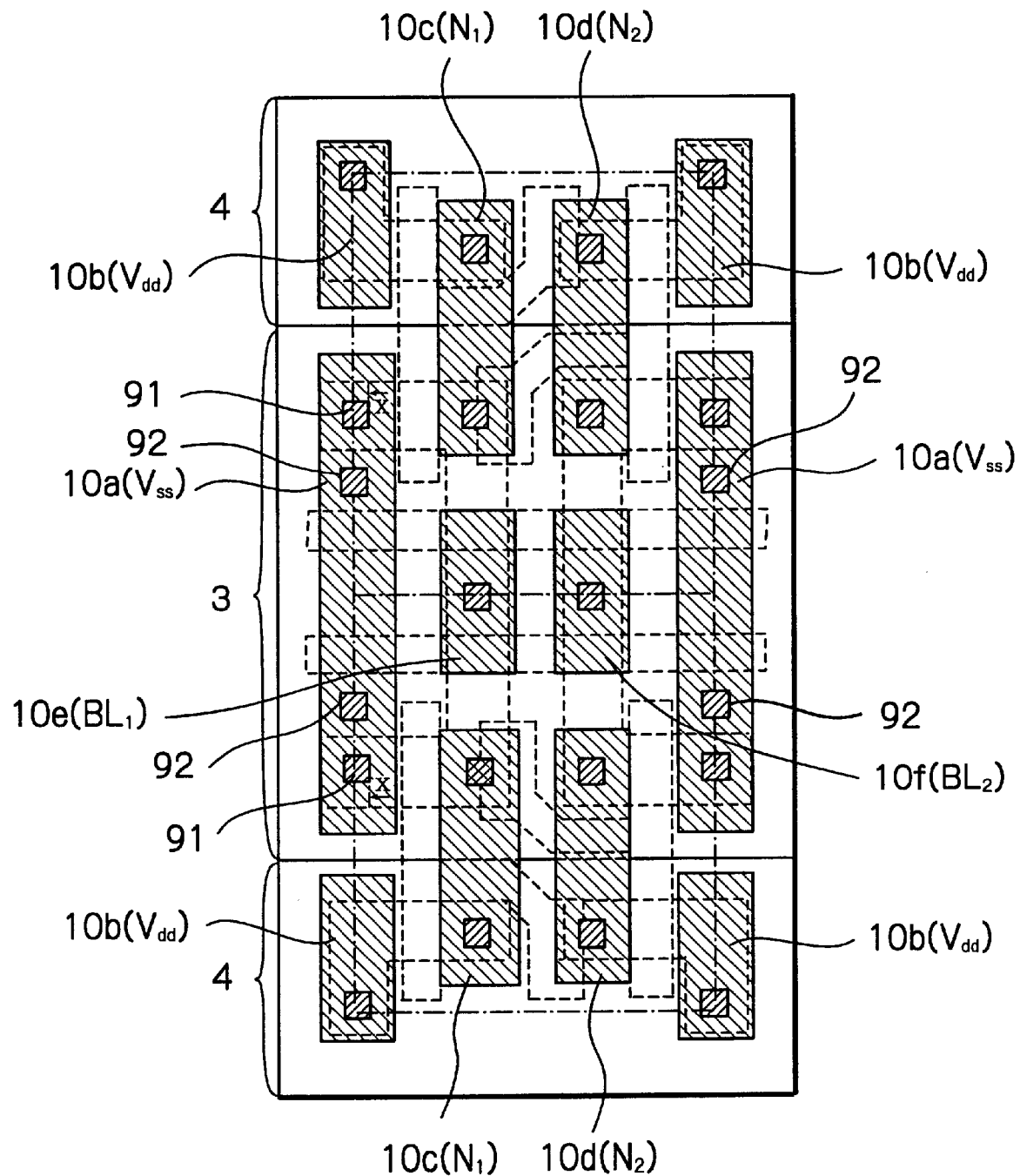
FIGS. 10A and 10B are plan and cross-sectional views illustrating modifications of FIGS. 8A and 8B, respectively.
Figure 10B:
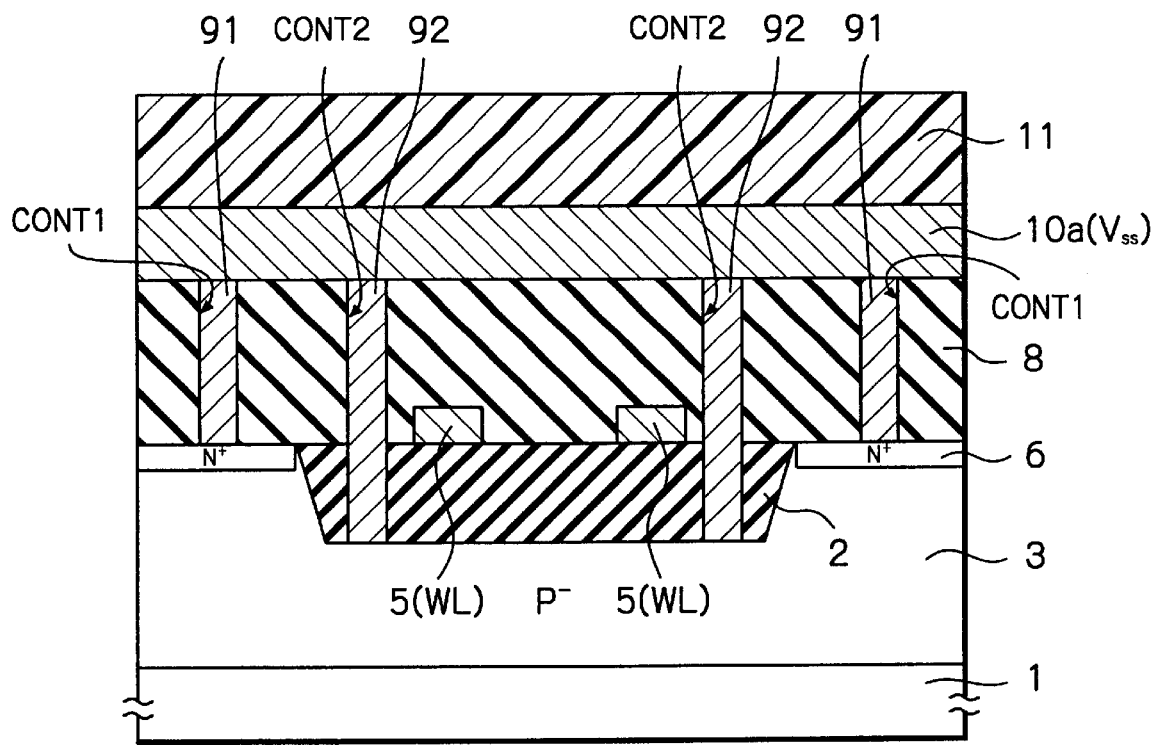

In the above-described embodiment, although the metal plugs 92 buried in the contact hole CONT2 are provided between the two word lines WL, the metal plugs 92 (the contact holes CONT2) can be provided between the word line WL and the $N_+$-type impurity diffusion region 6 as illustrated in FIGS. 10A and 10B.

In the above-described embodiment, since use is made of the same photomask for the contact holes CONT1 and CONT2, the additional manufacturing cost is unnecessary.

As explained hereinabove, the latch-up phenomenon can be suppressed or avoided. Also, since the suppression of the latch-up phenomenon can reduce the spacing between the $N^+$-type impurity diffusion regions and the $P^+$-type diffusion regions, the integration density can be enhanced.

What is claimed is:

1. A semiconductor memory device comprising:

a semiconductor substrate;

a well formed on said semiconductor substrate;

a thick field insulating layer, formed on said well, for surrounding an active area of said well;

at least two word lines formed on said thick field insulating layer and both word lines at least partially overlying said well; and a contact structure buried in a contact hole provided between said word lines in said thick field insulating layer and connected to said well, so as to fix a voltage at said well.

2. A semiconductor memory device comprising:

a semiconductor substrate;

a well formed on said semiconductor substrate;

a thick field insulating layer, formed on said well, for surrounding an active area of said well;

at least two word lines, formed on said thick field insulating layer and both word lines at least partially overlying said well; and contact structures buried in:,contact holes provided outside of said word lines in said thick field insulating layer and connected to said well, so as to fix a voltage at said well.

3. A CMOS-type static random access memory device comprising:

a semiconductor substrate;

a plurality of memory cells each including a first well of a first conductivity type and a second well of a second conductivity type formed on said semiconductor substrate, each of said memory cells comprising first and second transfer transistors formed in said second well, first and second drive transistors formed in said second well, and first and second load transistors formed in said first well;

a thick field insulating layer, formed on said first and second wells, for isolating said first and second transfer transistors, said first and second drive transistors and said first and second load transistors from; each other; and a contact structure formed in a contact hole provided in said thick field insulating layer, so as to fix a voltage at said second well.

4. The device as set forth in claim 3, further comprising a plurality of word lines formed on said thick field insulating layer and connected to gates of said first and second transfer transistors of respective ones of said memory cells, said contact hole being provided between two adjacent ones of said word lines.

5. The device as set forth, in claim 3, further comprising a plurality of word lines formed on said thick field insulating layer and connected to gates of said first and second transfer transistors of respective ones of said memory cells, said contact hole being provided outside of two adjacent ones of said word lines.

6. The device as set forth in claim 3, wherein said first conductivity type is a P-type, and said second conductivity type is an N-type.

* * * * *